United States Patent
Vadivelu et al.

(10) Patent No.: US 10,862,730 B2
(45) Date of Patent: Dec. 8, 2020

(54) SELECTIVE CONNECTION FOR INTERFACE CIRCUITRY

(71) Applicant: Intel Corporation, Santa Clara, CA (US)

(72) Inventors: Karthi Vadivelu, Folsom, CA (US); Choon Gun Por, Georgetown (MY)

(73) Assignee: Intel Corporation, Santa Clara, CA (US)

( * ) Notice: Subject to any disclaimer, the term of this patent is extended or adjusted under 35 U.S.C. 154(b) by 84 days.

(21) Appl. No.: 16/144,108

(22) Filed: Sep. 27, 2018

(65) Prior Publication Data

US 2019/0044785 A1 Feb. 7, 2019

(51) Int. Cl.
  *G06F 13/20* (2006.01)
  *H04L 29/06* (2006.01)
  *G06F 13/42* (2006.01)
  *G06F 13/40* (2006.01)
  *H05K 1/02* (2006.01)

(52) U.S. Cl.
  CPC ......... *H04L 29/06* (2013.01); *G06F 13/4004* (2013.01); *G06F 13/4282* (2013.01); *H04L 69/08* (2013.01); *H04L 69/18* (2013.01); *H05K 1/0213* (2013.01)

(58) Field of Classification Search
  None
  See application file for complete search history.

(56) References Cited

U.S. PATENT DOCUMENTS

| 2006/0047982 A1* | 3/2006 | Lo ........................... G06F 1/266 713/300 |
| 2008/0019357 A1* | 1/2008 | Martinez ............... G06F 3/0607 370/368 |
| 2015/0200187 A1* | 7/2015 | Park ....................... H01L 24/73 257/777 |
| 2017/0192924 A1* | 7/2017 | Chiba .................. G06F 13/4282 |

* cited by examiner

*Primary Examiner* — Henry Tsai
*Assistant Examiner* — Dean Phan
(74) *Attorney, Agent, or Firm* — Schwabe, Williamson & Wyatt, P.C.

(57) ABSTRACT

Embodiments may include systems and methods for communication including a plurality of controllers and coordination circuitry, to control communication to or from an interface circuitry. The interface circuitry includes a plurality of pins, where a first group of pins of the plurality of pins is for a first communication protocol, and a second group of pins of the plurality of pins is for a second communication protocol. A first controller is coupled to the interface circuitry through the first group of pins, and a second controller is coupled to the interface circuitry through the second group of pins. The coordination circuitry is to select the first controller or the second controller to control communication to or from the interface circuitry. Other embodiments may be described and/or claimed.

24 Claims, 6 Drawing Sheets

SELECTIVE CONNECTION FOR INTERFACE CIRCUITRY

FIELD

Embodiments herein relate generally to the technical field of communication and computing, and more particularly to interface circuitry of a computing bus.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

A computer bus or a communication link may be a part of a communication system that facilitates transfer of data between devices or components inside or between computing or communication devices, coupled to the computer bus. A device or component may be coupled to a computing bus through an interface circuitry. A computer bus, in addition to the hardware components (wire, optical fiber, etc.), may have associated software, communication protocols, and so forth. A communication protocol may be a set of rules that allow two devices to communicate information on a computer bus or a communication link between them. There may be many kinds of computer bus, such as serial buses or parallel buses. And there may be multiple generations of a computer bus.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

As described earlier, a computer bus or a communication link may be a part of a communication system that facilitates transfer of data between devices or components. An external device to a computer device may be coupled to a computer bus of the computer device through an interface circuitry of the computer device. Operations of the computer bus may be based on various standards or communication protocols, e.g., a universal serial bus (USB) protocol for the USB bus, a peripheral component interconnect (PCI) protocol for the PCI bus, and so forth. In addition, protocols may be updated from time to time, while maintaining backward compatibility for various generations of the computer bus and its protocols. However, technology change, e.g., changes on fabrication technologies, may make it difficult to maintain the backward compatibility.

In embodiments, an interface circuitry includes a plurality of pins, a selected group of which functions together to communicate with a computing device in a selected one of a plurality of communication protocols. A first group of pins of the plurality of pins forms an interface for a first communication protocol, while a second group of pins of the plurality of pins forms an interface for a second communication protocol. The first and second group of pins differ from each other at least in part. A first controller is coupled to the interface circuitry through the first group of pins and a second controller is coupled to the interface circuitry through the second group of pins. A coordination circuitry is to select the first controller to control communication to or from the first group of pins according to the first communication protocol, or select the second controller to control communication to or from the second group of pins according to the second communication protocol. The first and second communication protocols differ also differ at least in part.

In embodiments, an apparatus for communication includes a first controller, a second controller communicatively coupled to the first controller, and coordination circuitry either coupled to the first and second controllers, or disposed in part in the first controller and in part in the second controller. The first controller is arranged to operate at a first voltage level to control communication from or to a first group of pins of an interface circuitry according to a first communication protocol. The second controller is arranged to operate at a second voltage level to control communication from or to a second group of pins of the interface circuitry according to a second communication protocol. The first and second groups of pins of the interface circuitry are different pins at least in part. The first and second voltage levels are different voltage levels. The first and second communication protocols are different communication protocols at least in part. The coordination circuitry is to cause the first controller and the second controller to operate as a unified controller for the interface circuitry for communication in either the first or second communication protocol.

In embodiments, an apparatus for communication includes a first die having first control circuitry, a second die communicatively coupled to the first die and having second control circuitry, and coordination circuitry, either coupled to the first and second control circuitry, or disposed in part in the first control circuitry and in part in the second control circuitry. The first and second dice are different dice. The first control circuitry is to control communication from or to a first group of pins of a connector according to a first generation of a serial communication protocol. The second control circuitry is to control communication from or to a second group of pins of the connector according to a second generation of the serial communication protocol. The first and second group of pins of the connector are different pins at least in part. The coordination circuitry is to cause the first and second control circuitry to operate as unified control circuitry for the connector for communication in either the first or the second generation serial communication protocol.

In embodiments, an apparatus for computing includes a printed circuit board (PCB), a computer processor disposed on the PCB, and a communication port disposed at an edge of the PCB. The apparatus further includes a first controller to control communication from or to a first group of pins of the communication port according to a first communication protocol, and a second controller communicatively coupled to the first controller and to control communication from or to a second group of pins of the communication port according to a second communication protocol. The first and second group of pins are different pins at least in part. In addition, the apparatus includes one or more state machines to cause the first and second controllers to operate as a unified controller for the communication port for communication in either the first or second communication protocol.

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

Operations of various methods may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiments. Various additional operations may be performed and/or described operations may be omitted, split or combined in additional embodiments.

For the purposes of the present disclosure, the phrases "A/B," "A or B," and "A and/or B" mean (A), (B), or (A and B). For the purposes of the present disclosure, the phrases "A, B, or C" and "A, B, and/or C" mean (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As discussed herein, the term "module" may be used to refer to one or more physical or logical components or elements of a system. In some embodiments, a module may be a distinct circuit, while in other embodiments a module may include a plurality of circuits.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

The terms "coupled with" and "coupled to" and the like may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. By way of example and not limitation, "coupled" may mean two or more elements or devices are coupled by electrical connections on a printed circuit board such as a motherboard, for example. By way of example and not limitation, "coupled" may mean two or more elements/devices cooperate and/or interact through one or more network linkages such as wired and/or wireless networks. By way of example and not limitation, a computing apparatus may include two or more computing devices "coupled" on a motherboard or by one or more network linkages.

As used herein, the term "circuitry" refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD), (for example, a field-programmable gate array (FPGA), a programmable logic device (PLD), a complex PLD (CPLD), a high-capacity PLD (HCPLD), a structured ASIC, or a programmable System on Chip (SoC)), digital signal processors (DSPs), etc., that are configured to provide the described functionality. In some embodiments, the circuitry may execute one or more software or firmware programs to provide at least some of the described functionality.

As used herein, the term "processor circuitry" may refer to, is part of, or includes circuitry capable of sequentially and automatically carrying out a sequence of arithmetic or logical operations; recording, storing, and/or transferring digital data. The term "processor circuitry" may refer to one or more application processors, one or more baseband processors, a physical central processing unit (CPU), a single-core processor, a dual-core processor, a triple-core processor, a quad-core processor, and/or any other device capable of executing or otherwise operating computer-executable instructions, such as program code, software modules, and/or functional processes.

As used herein, the term "interface circuitry" may refer to, is part of, or includes circuitry providing for the exchange of information between two or more components or devices. The term "interface circuitry" may refer to one or more hardware interfaces (for example, buses, input/output (I/O) interfaces, peripheral component interfaces, network interface cards, and/or the like).

As used herein, the term "computer device" may describe any physical hardware device capable of sequentially and automatically carrying out a sequence of arithmetic or logical operations, equipped to record/store data on a machine readable medium, and transmit and receive data from one or more other devices in a communications network. A computer device may be considered synonymous to, and may hereafter be occasionally referred to, as a computer, computing platform, computing device, etc. The term "computer system" may include any type interconnected electronic devices, computer devices, or components thereof.

Additionally, the term "computer system" and/or "system" may refer to various components of a computer that are communicatively coupled with one another. Furthermore, the term "computer system" and/or "system" may refer to multiple computer devices and/or multiple computing systems that are communicatively coupled with one another and configured to share computing and/or networking resources. Examples of "computer devices", "computer systems", etc. may include cellular phones or smart phones, feature phones, tablet personal computers, wearable computing devices, an autonomous sensors, laptop computers, desktop personal computers, video game consoles, digital media players, handheld messaging devices, personal data assistants, an electronic book readers, augmented reality devices, server computer devices (e.g., stand-alone, rack-mounted, blade, etc.), cloud computing services/systems, network elements, in-vehicle infotainment (IVI), in-car entertainment (ICE) devices, an Instrument Cluster (IC), head-up display (HUD) devices, onboard diagnostic (OBD) devices, dashtop mobile equipment (DME), mobile data terminals (MDTs), Electronic Engine Management Systems (EEMSs), electronic/engine control units (ECUs), vehicle-embedded computer devices (VECDs), autonomous or semi-autonomous driving vehicle (hereinafter, simply ADV) systems, in-vehicle navigation systems, electronic/engine control modules (ECMs), embedded systems, microcontrollers, control modules, engine management systems (EMS), networked or "smart" appliances, machine-type communications (MTC) devices, machine-to-machine (M2M), Internet of Things (IoT) devices, and/or any other like electronic devices. Moreover, the term "vehicle-embedded computer device" may refer to any computer device and/or computer system physically mounted on, built in, or otherwise embedded in a vehicle.

As used herein, the term "network element" may be considered synonymous to and/or referred to as a networked computer, networking hardware, network equipment, router, switch, hub, bridge, radio network controller, radio access network device, gateway, server, and/or any other like device. The term "network element" may describe a physical computing device of a wired or wireless communication network and be configured to host a virtual machine. Furthermore, the term "network element" may describe equipment that provides radio baseband functions for data and/or voice connectivity between a network and one or more users. The term "network element" may be considered synonymous to and/or referred to as a "base station." As used herein, the term "base station" may be considered synonymous to and/or referred to as a node B, an enhanced or eNB, gNB, base transceiver station (BTS), access point (AP), roadside unit (RSU), etc., and may describe equipment that provides the radio baseband functions for data and/or voice connectivity between a network and one or more users. As used herein, the terms "vehicle-to-vehicle" and "V2V" may refer to any communication involving a vehicle as a source or destination of a message. Additionally, the terms "vehicle-to-vehicle" and "V2V" as used herein may also encompass or be equivalent to vehicle-to-infrastructure (V2I) communications, vehicle-to-network (V2N) communications, vehicle-to-pedestrian (V2P) communications, or V2X communications.

As used herein, the term "channel" may refer to any transmission medium, either tangible or intangible, which is used to communicate data or a data stream. The term "channel" may be synonymous with and/or equivalent to "physical channel," "communications channel," "data communications channel," "transmission channel," "data transmission channel," "access channel," "data access channel," "link," "data link," "carrier," "radiofrequency carrier," and/or any other like term denoting a pathway or medium through which data is communicated. Additionally, the term "link" may refer to a connection between two devices through a Radio Access Technology (RAT) for the purpose of transmitting and receiving information.

Figure 1:
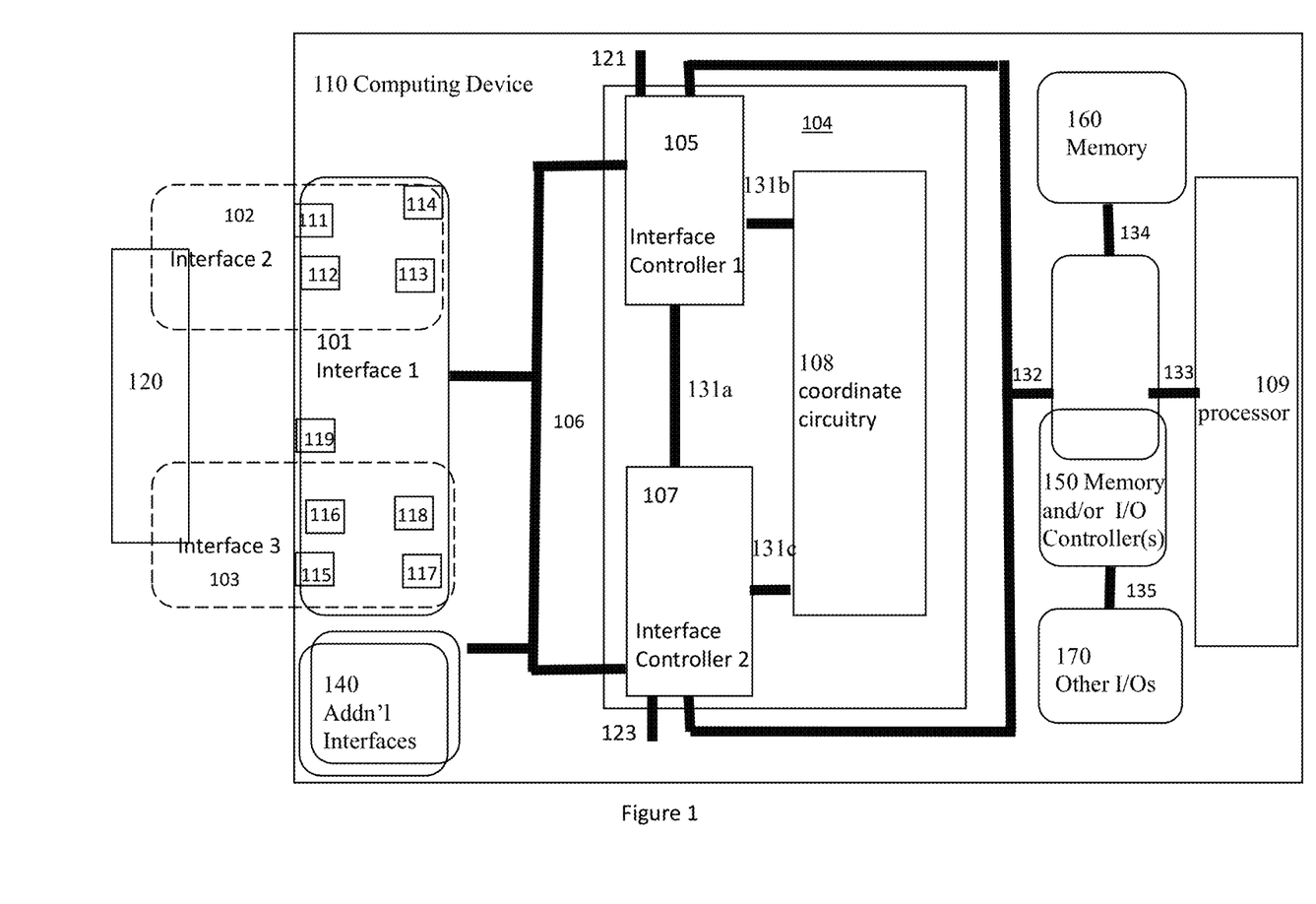
FIG. 1 illustrates an example computing device including the present disclosure having a coordination circuitry to select a controller to control communication according to a communication protocol, in accordance with various embodiments.

FIG. 1 illustrates an example computing device 110 including the present disclosure having a coordination circuitry to select a controller to control communication to or from interface circuitry, according to a corresponding communication protocol, in accordance with various embodiments. For clarity, features of the computing device 110, the coordination circuitry 108, the controllers 105 and 107, and the interface circuitry 101 are described below as an example of a computing device including a coordination circuitry to select a controller to control communication to or from an interface circuitry according to a corresponding communication protocol. It is to be understood that there may be more or fewer components included in the computing device 110, the coordination circuitry 108, the controllers 105 and 107, and the interface circuitry 101. Further, it is to be understood that one or more of the devices and components within the computing device 110, the coordination circuitry 108, the controllers 105 and 107, and the interface circuitry 101 may include additional and/or varying features from the description below, and may include any device that one having ordinary skill in the art would consider and/or refer to as a computing device including a coordination circuitry coupled to an interface circuitry to select a controller to control communication according to a communication protocol.

In embodiments, the computing device 110 includes the interface circuitry 101, a controller 105, a controller 107, the coordination circuitry 108, and a processor 109. Additional components, e.g., such as a memory 160, one or more memory or input/output (I/O) controllers 150, or other I/O devices 170, may be included in the computing device as well. The computing device 110 further includes additional interface circuitry 140. The controller 105, the controller 107, the coordination circuitry 108, the processor 109, the memory 160, the one or more memory or I/O controllers 150, or the other I/O devices 170, are coupled together by one or more interconnects, e.g., an interconnect 131a, an interconnect 131b, an interconnect 131c, an interconnect 132, an interconnect 133, an interconnect 134, and an interconnect 135. In addition, the controller 105 and the controller 107 are coupled to the interface circuitry 101, or the additional interface circuitry 140 by an interconnect bus 106.

In embodiments, the controller 105 is arranged to operate at a voltage 121, while the controller 107 is arranged to operate at a voltage 123, where the voltage 121 and the voltage 123 have different voltage levels. For example, the voltage level for the voltage 121 is less than 3.0 voltage, and the voltage level for the voltage 123 is larger than or equal to 3.3 voltage. The controller 105 is communicatively coupled to the controller 107.

In embodiments, the computing device 110 is to be coupled to an external device 120 through the interface circuitry 101. The computing device 110 may operate with the interface circuitry 101 as upstream facing ports in a device mode, while the external device 120 may operate in a host mode. Additionally and alternatively, the computing device 110 may operate in a host mode with the interface circuitry 101 as downstream facing ports to the external device 120, while the external device 120 may operate in a device mode.

In embodiments, the interface circuitry 101 includes a plurality of pins, e.g., a pin 111, a pin 112, a pin 113, a pin 114, a pin 115, a pin 116, a pin 117, a pin 118, and a pin 119. The number of pins are illustrated as examples only, and the interface circuitry 101 may have different number pins. The plurality of pins, e.g., the pin 111 to the pin 119, individual groups of which may function together to facilitate communicate between the computing device 110 and the external device 120 according to a selected communication protocol. The plurality of pins, e.g., the pin 111 to the pin 119, may include a first group of pins, e.g., the pin 111 to the pin 114, to form an interface 102 for a first communication protocol, and a second group of pins, e.g., the pin 115 to the pin 118, to form an interface 103 for a second communication protocol. In addition, the interface circuitry 101 may include one or more pins, e.g., the pin 119 (with some or none of pins 111-118), to be used for communication in a third communication protocol, differs from the first and second communication protocols.

In embodiments, the controller 105 is coupled to the interface circuitry 110 through the first group of pins, e.g., the pin 111 to the pin 114, while communications to or from the pin 111 to the pin 114 are according to the first communication protocol. The controller 107 is coupled to the interface circuitry 110 through the second group of pins, e.g., the pin 115 to the pin 118, while communications to or from the pin 115 to the pin 118 are according to the second communication protocol.

In embodiments, when the computing device 110 is to operate in the host mode with interface circuitry 101 as downstream facing ports to the external device 120, the controller 105 is to detect a first connection request from the external device 120 through the first group of pins of the interface 102. Similarly, the controller 107 is to detect a second connection request from the external device 120 through the second group of pins of the interface 103.

In embodiments, when the computing device 110 is to operate in the device mode with interface circuitry 101 as upstream facing ports to the external device 120 that is to operate as the host, the coordination circuitry 108 is to select the controller 105 to control communication with the computing device 120, through the first group of pins of the interface 102, according to the first communication protocol. Additionally and alternatively, the coordination circuitry 108 is to select the controller 107 to control communication with the external device 120, through the second group of pins of the interface 103, according to the second communication protocol. As a result, the interface circuitry 101 may function as a unified controller for communication in either the first or second communication protocol to communicate with the external device 120 without an extra interface circuitry.

In embodiments, the first protocol, and the second protocol may be a bi-directional communication protocol, or a half-duplex communication protocol. The first protocol and the second protocol may be related to each other. For example, the first protocol may be a first generation of a serial communication protocol, and the second protocol may be a second generation of a serial communication protocol. The first communication protocol is a USB 3.x protocol, the second communication protocol is a USB 2.0 or USB 1.1 protocol, and the interface circuitry is a USB type-C interface circuitry.

Additionally and alternatively, the third communication protocol is a selected one of a mobile industry processor interface display serial interface (MIPI-DSI) protocol, a high-definition multimedia interface (HDMI) protocol, a display port (DP) protocol, a Miracast protocol, a wireless display (WiDi) protocol, a serial peripheral interface (SPI) protocol, a scalable coherent interface (SCI) protocol, a small computer system interface (SCSI) protocol, a peripheral component interconnect (PCI) protocol, a parallel advanced technology attachment (PATA) protocol, a serial ATA (SATA) protocol, an IEEE 1394 interface (FireWire) protocol, an inter-integrated circuit ($I^2C$) protocol, a small computer system interface (SCSI) protocol, or other computer bus protocols.

In embodiments, except for the teachings of the present disclosure incorporated, the computing device 110 may otherwise be any computing system, for example, a laptop computer, an ultra-laptop computer, a tablet, a touch pad, a portable computer, a handheld computer, a wearable device, a palmtop computer, a personal digital assistant (PDA), an e-reader, a cellular telephone, a combination cellular telephone/PDA, a mobile smart device (e.g., a smart phone, a smart tablet, etc.), a mobile internet device (MID), a mobile messaging device, a mobile data communication device, a mobile media playing device, a camera, a mobile gaming console, etc. In embodiments, the computing device 110 may also be a non-mobile device that may include, but is not to be limited to, for example, a personal computer (PC), a television, a smart television, a data communication device, a media playing device, a gaming console, a gateway, an Internet of Things (IOT) device, etc. The computing device 110 include processors (such as processor 109) and other components that execute software and/or control hardware to execute local programs or consume services provided by external service providers over a network. The computing device 110 may also, or instead, include a web interface running in a browser from which the electronic apparatus can access such web-based services. The computing device 110 may also include storage devices to store logic and data associated with the programs and services used by the computing device 110.

In embodiments, the processor 109 may be a central processing unit (CPU) located in a printed circuit board (PCB). In some embodiments, the processor 109 may be a programmable device that may execute a program. In embodiments, the processor 109 may be a microcontroller, a 16-bit processor, a 32-bit processor, a 64-bit processor, a single core processor, a multi-core processor, a digital signal processor, an embedded processor, or any other processor. In embodiments, an operating system may be operated on the processor 109, which may include the system driver for various protocols, the first protocol, or the second protocol. The operating system may include any system software that manages hardware or software resources for the computing device 110, and may provide services to applications. The operating system may be Windows®, Android OS, iOS, Linux, a real-time operating system (RTOS), an automotive infotainment operating system, among others. For example, the operating system may be a real-time operating system such as VxWorks, PikeOS, eCos, QNX, MontaVista Linux, RTLinux, Windows CE, or other operating system.

In embodiments, the computing device 110, the coordination circuitry 108, the controller 105, the controller 107, and the processor 109 may be implemented in various ways. The controller 105 and the controller 107 may be implemented as control circuitries. The interface circuitry 101 may be implemented as a connector or a communication port. For example, the coordination circuitry 108 may be either coupled to the first and second controllers, or disposed in part in the controller 105 and in part in the controller 107. The computing device 110, the coordination circuitry 108, the controller 105, the controller 107, and the processor 109 may be implemented by a computing platform 500 shown in FIG. 5, and may execute instructions stored in a computer-readable medium, e.g., the computer-readable medium 602 as shown in FIG. 6, or may be pre-configured with the logic (e.g., with appropriate bit streams, logic blocks, etc.).

Figure 2:
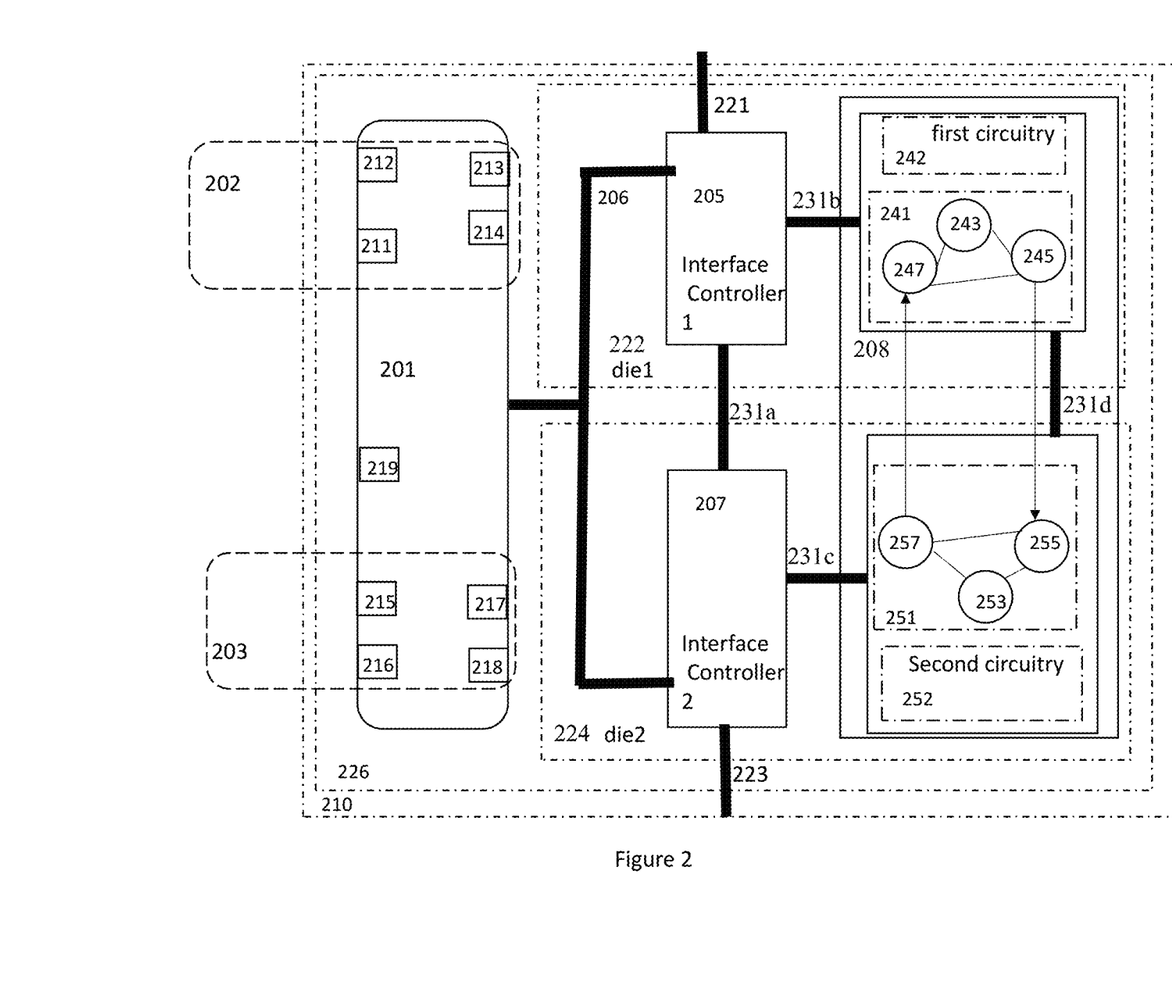
FIG. 2 illustrates an example computing device including the present disclosure having a coordination circuitry with two finite state machines to select a controller to control communication according to a communication protocol, in accordance with various embodiments.

FIG. 2 illustrates an example computing device 210 including the present disclosure having a coordination circuitry 208 with two finite state machines to select a controller to control communication according to a communication protocol, in accordance with various embodiments. In embodiments, the computing device 210 and the coordination circuitry 208 may be examples of the computing device 110 and the coordination circuitry 108, as shown in FIG. 1. The detailed description for each part of the computing device 210 and the coordination circuitry 208 may be similar to the description of a similar part for the computing device 110 and the coordination circuitry 108.

In embodiments, the computing device 210 includes a controller 205, a controller 207, and the coordination circuitry 208. The computing device 210 also includes interface circuitry 201. Furthermore, computing device 210 may include a processor, memory, one or more memory or I/O controllers, or other I/O devices, not shown.

In embodiments, the controller 205, the controller 207, and the coordination circuitry 208 are coupled together by one or more interconnects, e.g., an interconnect 231a, an interconnect 231b, and an interconnect 231c. In addition, the controller 205 and the controller 207 are coupled to the interface circuitry 201 by an interconnect bus 206. The coordination circuitry 208 includes a first finite state machine 241 and a second finite state machine 251 coupled to the first finite state machine 241 by an interconnect 231d.

In embodiments, the computing device 210 is to be coupled to an external computing device through the interface circuitry 201. The computing device 210 may operate in a device mode with interface circuitry 201 as upstream facing ports to the external computing device, or operate in a host mode with interface circuitry 201 as downstream facing ports to the external device.

In embodiments, the interface circuitry 201 includes a plurality of pins, e.g., a pin 211, a pin 212, a pin 213, a pin 214, a pin 215, a pin 216, a pin 217, a pin 218, and a pin 219. A first group of pins, e.g., the pin 211 to the pin 214, forms an interface 202 for a first communication protocol, while a second group of pins, e.g., the pin 215 to the pin 218, forms an interface 203 for a second communication protocol. The plurality of pins, e.g., the pin 211 to the pin 219, selected groups of which may function together to communicate with an external device as a unified controller for communication in either the first, second or even a third communication protocol. The first, second and third communication protocols are different communication protocols.

Figure 3:
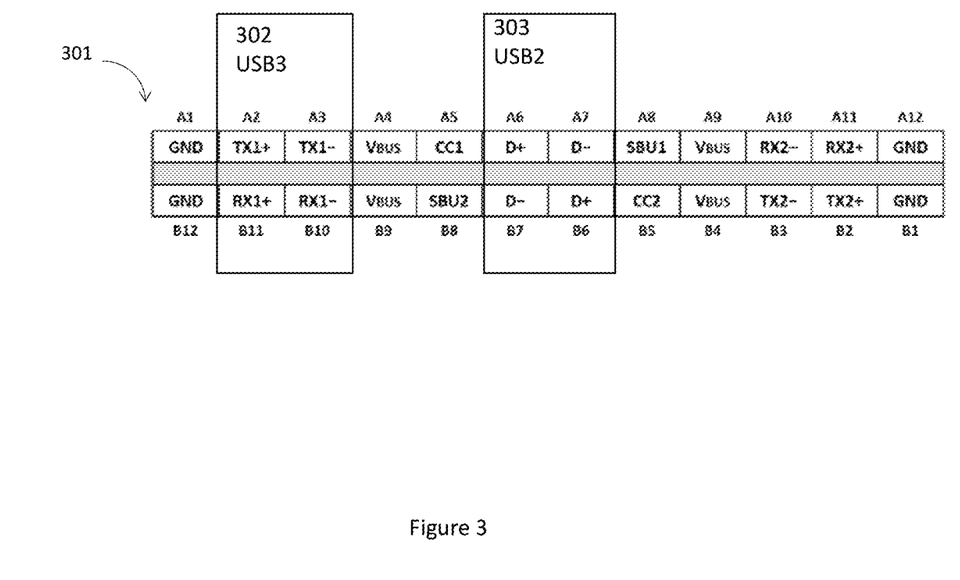
FIG. 3 illustrates an example interface circuitry including a plurality of pins, in accordance with various embodiments.

As an example, as illustrated in FIG. 3, the interface circuitry 301 includes a plurality of pins, e.g., pins A1 to A12, and pins B1 to B12, forming a USB type-C connector. Group of these pins function together to communicate with a computing device according to a USB 3.x or 2.0/1.1 protocol. More specifically, a first group of pins, including e.g., the pins A2 and A3, B10 and B11, forms an interface 302 for communication in accordance with USB 3.x protocol. In addition, a second group of pins, including e.g., the pin A6 and A7, B6 and B7, forms an interface 303 for communication in accordance with USB 2.0 or USB 1.1 protocol.

In embodiments, the controller 205 is coupled to the interface circuitry 201 through the first group of pins, e.g., the pin 211 to the pin 214. The controller 207 is coupled to the interface circuitry 201 through the second group of pins, e.g., the pin 215 to the pin 218. When the computing device 210 is to operate in the device mode with the interface circuitry 201 as upstream facing ports to an external device that is to operate as the host, the coordination circuitry 208 is to select the controller 205 to control communication through the first group of pins of the interface 202, according to the first communication protocol. Additionally and alternatively, the coordination circuitry 208 is to select the controller 207 to control communication to or from the second group of pins of the interface 203, according to the second communication protocol.

For example, the interface circuitry 201 is a USB type-C interface circuitry. The first communication protocol is a USB 3.x protocol, and the controller 205 is a USB 3.x controller. In addition, the second communication protocol is a USB 2.0 or USB 1.1 protocol, and the controller 207 is a USB 2.0 or USB 1.1 controller.

In embodiments, the coordination circuitry 208 includes the first finite state machine 241, a first circuitry 242, the second finite state machine 251, and a second circuitry 252. The first finite state machine 241 is to select the controller 205 to control communication through the first group of pins, e.g., the pin 211 to the pin 214, of the interface circuitry 201 according to the first communication protocol. Alternatively, the second finite state machine 251 is to select the controller 207 to control communication through the second group of pins, e.g., the pin 215 to the pin 218, of the interface circuitry 201, according to the second communication protocol.

In embodiments, the first finite state machine 241 includes a state 243, a state 245, and a state 247. When the first finite state machine 241 is in the state 243, the first finite state machine 241 selects the controller 205 to control communication through the first group of pins, e.g., the pin 211 to the pin 214, of the interface circuitry 201. In addition, the first finite state machine 241 sets the first circuitry 242 to indicate to an external device, e.g., a host, the controller 205 to control communication through the first group of pins, e.g., the pin 211 to the pin 214, of the interface circuitry 201.

For example, the first finite state machine 241 is to select the controller 205, which is a USB 3.x controller, to control communication according to the USB 3.x protocol through the first group of pins of the USB type-C interface circuitry. The first finite state machine 241 is also to set the first circuitry 242 to indicate the USB 3.x controller is to control communication. The second finite state machine 251 is to select the controller 207, which is a USB 2.0 or USB 1.1 controller to control communication according to the USB 2.0 or USB 1.1 protocol through the second group of pins of the USB type-C interface circuitry.

When the first finite state machine 241 fails to select the controller 205, the first finite state machine 241 moves to the state 245. In the state 245, the first finite state machine 241 acts as a master device to send a message to the second finite state machine 251 to activate the controller 207. Once the message is sent to the second finite state machine 251, the first finite state machine 241 moves to the state 247 to wait to receive messages from the second finite state machine 251.

For example, the controller 205 is a USB 3.x controller to control communication according to the USB 3.x protocol through the first group of pins of the USB type-C interface circuitry. The controller 207 is a USB 2.0 or USB 1.1 controller to control communication according to the USB 2.0 or USB 1.1 protocol through the second group of pins of the USB type-C interface circuitry. The first finite state machine 241 sends a message to the second finite state machine 251 to activate the controller 207 when the first finite state 241 machine has failed to select the USB 3.x controller to control communication according to the USB 3.x protocol through the first group of pins of the USB type-C interface circuitry.

The second finite state machine 251 is in the state 255 to receive the message from the first finite state machine 241. Once the second finite state machine 251 receives the message from the first finite state machine 241, the second finite state machine 251 attempts to select the controller 207 to control the communication. When the selection of the controller 207 is successful, the second finite state machine 251 moves to the state 253. In addition, the second finite state machine 251 further sets the second circuitry 252 to indicate the controller 207 to control communication through the second group of pins, e.g., the pin 215 to the pin 218, of the interface circuitry 201. For example, the second finite state machine 251 sets the second circuitry 252 to indicate the controller 207, e.g., a USB 2.0 or USB 1.1 controller, is to control communication.

On the other hand, when the selection of the controller 207 is not successful, the second finite state machine 251 moves to the state 257, and sends a message to the first finite state machine 241, which is in the state 247 to receive a message from the finite state machine 251. When the first finite state machine 241 in the state 247 receives the message from the second finite state machine 251, the first finite state machine 241 attempts to select the controller 205 to control the communication. When the selection of the controller 205 is successful, the first finite state machine 241 moves to the state 243. On the other hand, when the selection of the controller 207 is not successful, the first finite state machine 241 moves to the state 245, and sends a message to the second finite state machine 251. For example, the second finite state machine 251 sends a message to the first finite state machine 241 when the second finite state machine 251 has failed to select the USB 2.0 or USB 1.1 controller to control communication to the host according to the USB 2.0 or USB 1.1 protocol through the second group of pins of the USB type-C interface circuitry.

In embodiments, the controller 205 is on a die 222, which may also include the first finite state machine 241 and the first circuitry 242. In addition, the controller 207 is on a die 224, which may also include the second finite state machine 251 and the second circuitry 252. The computing device 210 including the interface circuitry 201, the controller 205, the controller 207, and the coordination circuitry 208 is within a package 226. The controller 205 operates at a first voltage 221, and the controller 207 operates at a second voltage 223 different from the first voltage. For example, the first voltage is larger than or equal to 3.3 voltage, and the second voltage is less than 3.0 voltage.

In some embodiments, the controller 205 is a USB 3.x controller, and the controller 207 is a USB 2.0 or USB 1.1 controller. A USB 2.0 is a legacy protocol operating at 3.3V. On the other hand, as the fabrication process technology improves, a high voltage, e.g., greater than or equal to 3.3V, may no longer supported. The computing device 210 including the controller 205 as a low voltage USB 3.x controller and the controller 207 as a high voltage USB 2.0 or USB 1.1 controller may solve the incompatibility of the legacy USB 2.0 on the advance process nodes with the new USB Type C based high-speed protocols and usages. The coordination circuitry 208 allows the distributed controllers, e.g., the controller 205 and the controller 207, to be seen as a single controller externally to the computing device 220. The coordination circuitry 208 may be implemented by various architectures and technologies. The first finite state machine 241 and the second finite state machine 251 are merely one way to implement the coordination circuitry 208.

Figure 4:
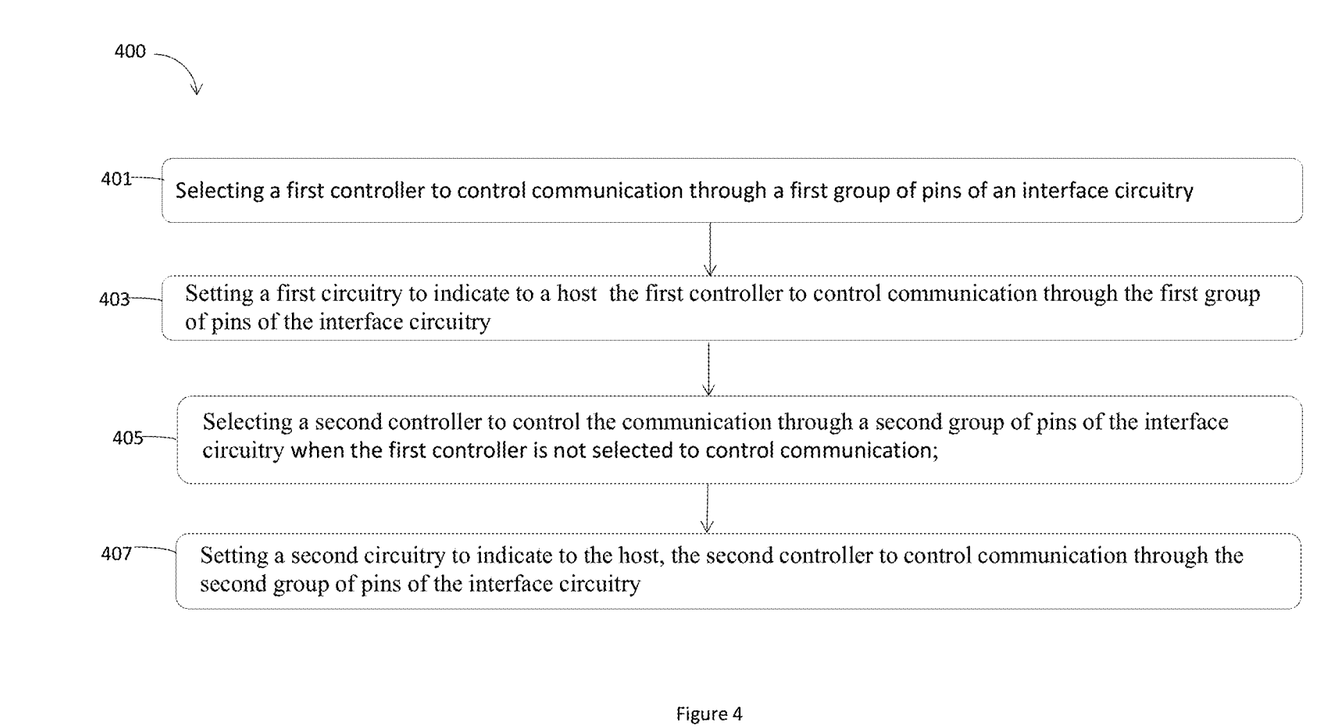
FIG. 4 illustrates an example process to be performed by a coordination circuitry coupled to an interface circuitry to select a controller to control communication according to a communication protocol, in accordance with various embodiments.

FIG. 4 illustrates an example process 400 to be performed by a coordination circuitry coupled to an interface circuitry to select a controller to control communication according to a communication protocol, in accordance with various embodiments. In embodiments, the process 400 may be a process performed by the coordination circuitry 108 coupled to the interface circuitry 101 to select a controller to control communication according to a communication protocol as described in FIG. 1, or performed by the coordination circuitry 208 coupled to the interface circuitry 201 to select a controller to control communication according to a communication protocol as described in FIG. 2.

The process 400 may start at an interaction 401. During the interaction 401, the coordination circuitry selects a first controller to control communication through a first group of pins of an interface circuitry. For example, at the interaction 401, the coordination circuitry 208 selects the controller 205 to control communication through the first group of pins, e.g., the pins 211 to pins 214, of the interface circuitry 201.

During an interaction 403, the coordination circuitry sets a first circuitry to indicate to a host the first controller to control communication through the first group of pins of the interface circuitry. For example, at the interaction 403, the coordination circuitry 208 sets the first circuitry 242 to indicate to a host, e.g., the computing device 220, the controller 205 to control communication through the first group of pins of the interface circuitry 201.

During an interaction 405, the coordination circuitry selects a second controller to control the communication through a second group of pins of the interface circuitry when the first controller is not selected to control communication. For example, at the interaction 407, the coordination circuitry 208 selects the controller 207 to control the communication through a second group of pins, e.g., the pins 215 to pins 218, of the interface circuitry 201 when the controller 205 is not selected to control communication.

During an interaction 407, the coordination circuitry sets a second circuitry to indicate to the host, the second controller to control communication through the second group of pins of the interface circuitry. For example, at the interaction 409, the coordination circuitry 208 sets the second circuitry 252 to indicate to the host, e.g., the computing device 220, the controller 207 to control communication through the second group of pins of the interface circuitry 201.

Figure 5:
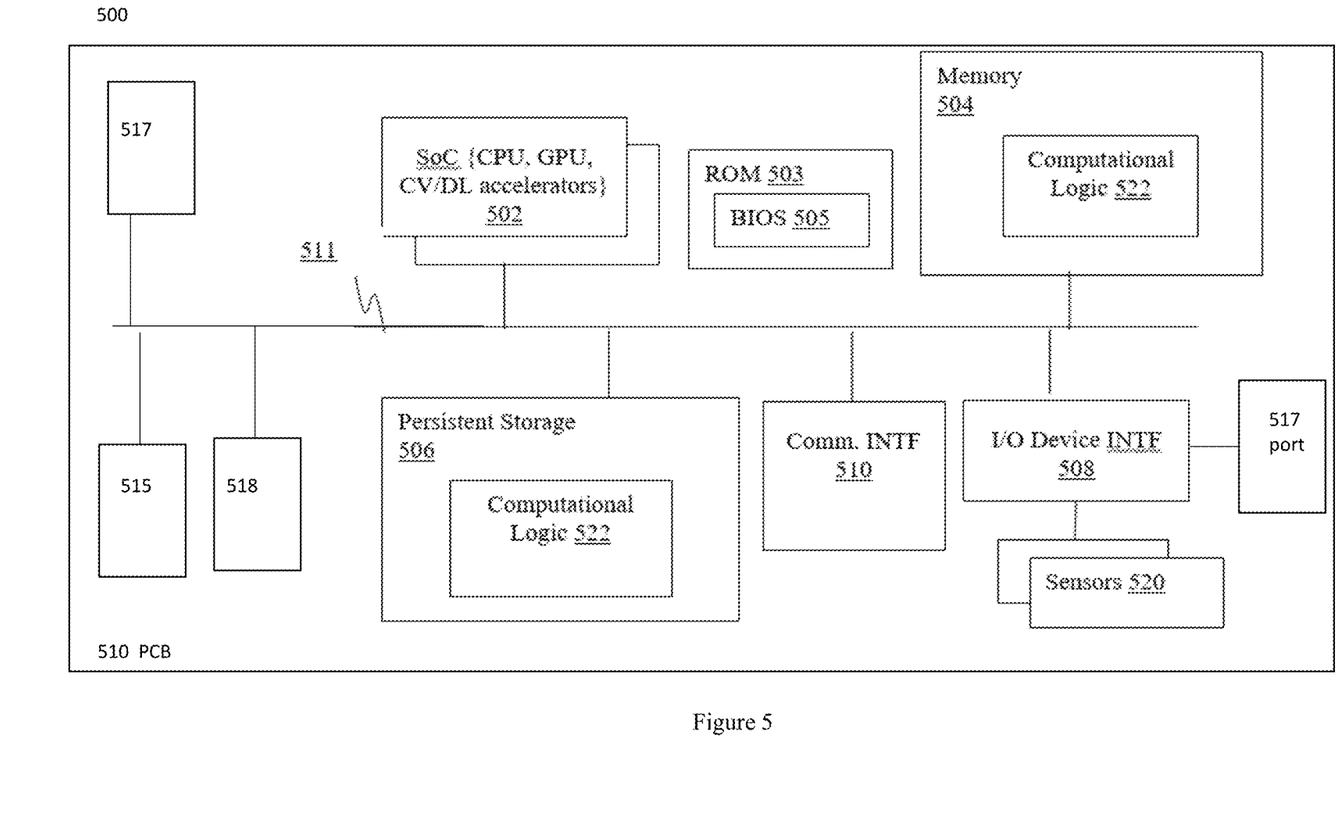
FIG. 5 illustrates a hardware component view of a computing platform suitable to practice the present disclosure, in accordance with various embodiments.
Figure 6:
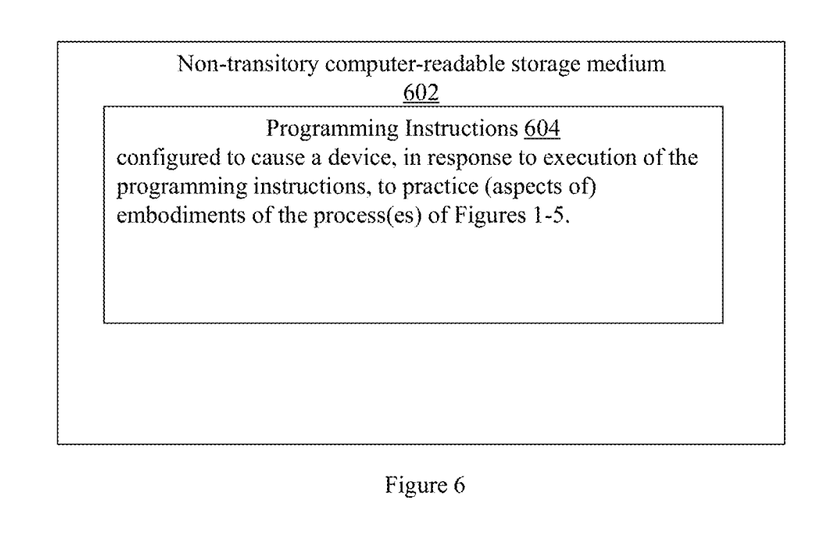
FIG. 6 illustrates a storage medium having instructions for practicing methods described with references to FIGS. 1-4, in accordance with various embodiments.

FIG. 5 illustrates a hardware component view of a computing platform 500 for a coordination circuitry coupled to an interface circuitry to select a controller to control communication according to a communication protocol, in accordance with various embodiments. As shown, the computing platform 500 may include one or more SoCs 502, ROM 503 and system memory 504. Each SoCs 502 may include one or more processor cores (CPUs), one or more graphics processor units (GPU), one or more accelerators, such as computer vision (CV) and/or deep learning (DL) accelerators. ROM 503 may include BIOS 505. CPUs, GPUs, and CV/DL accelerators may be any one of a number of these elements known in the art. Similarly, ROM 503 and basic input/output system services (BIOS) 505 may be any one of a number of ROM and BIOS known in the art, and system memory 504 may be any one of a number of volatile storage known in the art.

Additionally, computing platform 500 may include persistent storage devices 506. Example of persistent storage devices 506 may include, but are not limited to, flash drives, hard drives, compact disc read-only memory (CD-ROM) and so forth. Further, computing platform 500 may include input/output (I/O) device interface(s) 508 to interface with one or more I/O devices (such as display, keyboard, cursor control and so forth) and communication interfaces 510 (such as network interface cards, modems and so forth). In addition, I/O device 508 may include a connector/port 519, a controller 515 or a controller 517, and a coordination circuitry 518 coupled to the connector/port 519 to select a controller 515 or 517, to control communication to or from the connector/port 519 according to a communication protocol. The connector/port 519 may be similar to interface circuitry 101 of FIG. 1 or interface circuitry 201 of FIG. 2, and the coordination circuitry 518, the controller 515, or the controller 517 may be similar to the coordination circuitry 108, the controller 105, or the controller 107 in FIG. 1, or the coordination circuitry 208, the controller 205, or the controller 207 in FIG. 2. In some embodiments, the computing platform 500 may further include a number of sensors 520. Communication and I/O devices 508 may include any number of communication and I/O devices known in the art, a communication port 507, which may be an example of the interface circuitry 101 or the interface circuitry 201. Examples of communication devices may include, but are not limited to, networking interfaces for Bluetooth®, Near Field Communication (NFC), WiFi, Cellular communication (such as LTE, 4G, or 5G) and so forth. The elements may be coupled to each other via system bus 512, which may represent one or more buses. In the case of multiple buses, they may be bridged by one or more bus bridges (not shown). Sensors 520 may include light detection and ranging (LiDAR) sensors, geo-positioning sensors, gyroscopes, accelerometers, temperature sensors, humidity sensors, and so forth.

Except of connector/port 519, coordination circuitry 518, the controller 515, or the controller 517, each of the other elements may perform its conventional functions known in the art. In particular, ROM 503 may include BIOS 505 having a boot loader. In embodiments, system memory 504 and mass storage devices 506 may be employed to store a working copy and a permanent copy of the programming instructions implementing the operations associated with an operating system, one or more applications, collectively referred to as computational logic 522. The computational logic 522 may be implemented by assembler instructions supported by processor core(s) of SoCs 502 or high-level languages, such as, for example, C, that can be compiled into such instructions.

As will be appreciated by one skilled in the art, the present disclosure may be embodied as methods or computer program products. Accordingly, the present disclosure, in addition to being embodied in hardware as earlier described, may take the form of an entirely software embodiment (including firmware, resident software, micro-code, etc.) or an embodiment combining software and hardware aspects that may all generally be referred to as a "circuit," "module" or "system." Furthermore, the present disclosure may take the form of a computer program product embodied in any tangible or non-transitory medium of expression having computer-usable program code embodied in the medium.

FIG. 6 illustrates a storage medium having instructions for practicing methods described with references to FIGS. 1-4, in accordance with various embodiments. As shown, non-transitory computer-readable storage medium 602 may include a number of programming instructions 604. Programming instructions 604 may be configured to enable a device, e.g., a microcontroller or programmable circuit within I/O device interface 508 of computing platform 500, in response to execution of the programming instructions, to implement (aspects of) operations associated with the coordination circuitry and/or the controllers to select one of the controllers to control communication to or from an interface circtruiy according to a communication protocol, as earlier described. In alternate embodiments, programming instructions 604 may be disposed on multiple computer-readable non-transitory storage media 602 instead. In still other embodiments, programming instructions 604 may be disposed on computer-readable transitory storage media 602, such as, signals.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Embodiments may be implemented as a computer process, a computing system or as an article of manufacture such as a computer program product of computer readable media. The computer program product may be a computer storage medium readable by a computer system and encoding a computer program instructions for executing a computer process.

The corresponding structures, material, acts, and equivalents of all means or steps plus function elements in the claims below are intended to include any structure, material or act for performing the function in combination with other claimed elements are specifically claimed. The description of the present disclosure has been presented for purposes of illustration and description, but is not intended to be exhaustive or limited to the disclosure in the form disclosed. Many modifications and variations will be apparent to those of ordinary skill without departing from the scope and spirit of the disclosure. The embodiment was chosen and described in order to best explain the principles of the disclosure and the practical application, and to enable others of ordinary skill in the art to understand the disclosure for embodiments with various modifications as are suited to the particular use contemplated.

Thus various example embodiments of the present disclosure have been described including, but are not limited to:

Example 1 may include an apparatus for communication, comprising: a first controller arranged to operate at a first voltage level to control communication from or to a first group of pins of an interface circuitry, coupled to the apparatus, according to a first communication protocol; a second controller communicatively coupled to the first controller, and arranged to operate at a second voltage level to control communication from or to a second group of pins of the interface circuitry according to a second communication protocol; and coordination circuitry, either coupled to the first and second controllers, or disposed in part in the first controller and in part in the second controller, to cause the first controller and the second controller to operate as a unified controller for the interface circuitry for communication in either the first or second communication protocol; wherein the first and second voltage levels are different voltage levels; the first and second communication protocols are different communication protocols at least in part; and the first and second groups of pins are different pins at least in part.

Example 2 may include the apparatus of example 1 and/or some other examples herein, wherein the interface circuity, via the apparatus, is coupled to a host, and the apparatus is to operate in a device mode as upstream facing ports to the host.

Example 3 may include the apparatus of example 1 and/or some other examples herein, further including an interconnect to couple the coordination circuitry, the first controller, and the second controller.

Example 4 may include the apparatus of example 1 and/or some other examples herein, wherein the first voltage level is larger than or equal to 3.3 voltage, and the second voltage level is less than 3.0 voltage.

Example 5 may include the apparatus of example 1 and/or some other examples herein, wherein the first communication protocol is a USB 3.x protocol, the second communication protocol is a USB 2.0 or USB 1.1 protocol, and the interface circuitry is a USB type-C interface circuitry.

Example 6 may include the apparatus of example 1 and/or some other examples herein, the first protocol, or the second protocol is a bi-directional communication protocol, or a half-duplex communication protocol.

Example 7 may include the apparatus of example 1 and/or some other examples herein, wherein the interface circuitry further includes a third group of pins to facilitate communication to or from the third group of pins, according to a third communication protocol, selected from either a mobile industry processor interface display serial interface (MIPI-DSI) protocol, a high-definition multimedia interface (HDMI) protocol, a display port (DP) protocol, a Miracast protocol, a wireless display (WiDi) protocol, a serial peripheral interface (SPI) protocol, a scalable coherent interface (SCI) protocol, a small computer system interface (SCSI)

protocol, a peripheral component interconnect (PCI) protocol, or an inter-integrated circuit (I²C) protocol; wherein the third communication protocol differs from the first and second communication protocols, and the third group of pins differ from the first and second groups of pins, at least in part.

Example 8 may include the apparatus of example 1 and/or some other examples herein, wherein the coordination circuitry includes a first finite state machine, and a second finite state machine coupled to the first finite state machine by an interconnect; wherein the first finite state machine is to select the first controller to control communication to or from the first group of pins of the interface circuitry according to the first communication protocol; and wherein the second finite state machine is to select the second controller to control communication to or from the second group of pins of the interface circuitry according to the second communication protocol.

Example 9 may include the apparatus of example 8 and/or some other examples herein, wherein the first communication protocol is a USB 3.x protocol, the second communication protocol is a USB 2.0 or USB 1.1 protocol, and the interface circuitry is a USB type-C interface circuitry, the first controller is a USB 3.x controller, the second controller is a USB 2.0 or USB 1.1 controller, the first finite state machine is to select the USB 3.x controller to control communication according to the USB 3.x protocol through the first group of pins of the USB type-C interface circuitry, and the second finite state machine is to select the USB 2.0 or USB 1.1 controller to control communication according to the USB 2.0 or USB 1.1 protocol through the second group of pins of the USB type-C interface circuitry.

Example 10 may include an apparatus for communication, comprising: a first die having first control circuitry to control communication from or to a first group of pins of a connector according to a first generation of a serial communication protocol; a second die communicatively coupled to the first die and having second control circuitry to control communication from or to a second group of pins of the connector according to a second generation of the serial communication protocol; and coordination circuitry, either coupled to the first and second control circuitry, or disposed in part in the first control circuitry and in part in the second control circuitry, to cause the first and second control circuitry to operate as unified control circuitry for the connector for communication in either the first or second generation serial communication protocol; wherein the first and second dice are different dice; and the first and second group of pins are different pins at least in part.

Example 11 may include the apparatus of example 10 and/or some other examples herein, wherein the apparatus including the first die and the second die is within a package.

Example 12 may include the apparatus of example 10 and/or some other examples herein, wherein the connector, via the apparatus, is coupled to a host, and the apparatus is to operate in a device mode as upstream facing ports to the host.

Example 13 may include the apparatus of example 10 and/or some other examples herein, wherein the apparatus is to operate in a host mode as downstream facing ports to an external device coupled to the connector, and wherein the first controller is to detect a first connection request from the external device through the first group of pins, or the second controller is to detect a second connection request from the external device through the second group of pins.

Example 14 may include the apparatus of example 10 and/or some other examples herein, wherein the first generation of a serial communication protocol is a USB 3.x protocol, the second generation of the serial communication protocol is a USB 2.0 or USB 1.1 protocol, and the connector is a USB type-C connector.

Example 15 may include the apparatus of example 10 and/or some other examples herein, wherein the first die is to operate at a first voltage level, the second die is to operate at a second voltage level, and the first and second voltage levels are different voltage levels.

Example 16 may include the apparatus of example 10 and/or some other examples herein, wherein the coordination circuitry includes a first finite state machine, and a second finite state machine coupled to the first finite state machine by an interconnect, wherein the first finite state machine is to select the first control circuitry to control communication to or from the first group of pins of the connector according to the first generation of the serial communication protocol, and the second finite state machine is to select the second control circuitry to control communication to or from the second group of pins of the connector according to the second generation of the serial communication protocol.

Example 17 may include the apparatus of example 16 and/or some other examples herein, wherein the connector is a USB type-C connector, the first generation of the serial communication protocol is a USB 3.x protocol, and the second generation of the serial communication protocol is a USB 2.0 or USB 1.1 protocol, the first control circuitry is a USB 3.x controller, the second control circuitry is a USB 2.0 or USB 1.1 controller, the first finite state machine is to select the USB 3.x control circuitry to control communication according to the USB 3.x protocol to or from the first group of pins of the USB type-C connector, and the second finite state machine is to select the USB 2.0 or USB 1.1 control circuitry to control communication according to the USB 2.0 or USB 1.1 protocol to or from the second group of pins of the USB type-C connector.

Example 18 may include the apparatus of example 17 and/or some other examples herein, wherein the coordination circuitry further includes first and second circuitry; wherein the first circuity is coupled to the first finite state machine to indicate whether the USB 3.x controller is to control communication; and wherein the second circuity is coupled to the second finite state machine to indicate whether the USB 2.0 or USB 1.1 controller is to control communication.

Example 19 may include the apparatus of example 17 and/or some other examples herein, wherein the first finite state machine acts as a master device to the second finite state machine; wherein the first finite state machine sends a message to the second finite state machine to activate the second controller when the first finite state machine has failed to select the USB 3.x controller to control communication according to the USB 3.x protocol through the first group of pins of the USB type-C interface circuitry.

Example 20 may include the apparatus of example 17 and/or some other examples herein, wherein the second finite state machine sends a message to the first finite state machine when the second finite state machine has failed to select the USB 2.0 or USB 1.1 controller to control communication according to the USB 2.0 or USB 1.1 protocol through the second group of pins of the USB type-C interface circuitry.

Example 21 may include an apparatus for computing, comprising: a printed circuit board (PCB); a computer processor disposed on the PCB; a communication port disposed at an edge of the PCB; a first controller to control communication from or to a first group of pins of the communication port according to a first communication protocol; a second controller communicatively coupled to the first controller to control communication from or to a second group of pins of the communication port according to a second communication protocol; and one or more state machines to cause the first and second controllers to operate as a unified controller for the communication port for communication in either the first or second communication protocol; wherein the first and second group of pins are different pins at least in part.

Example 22 may include the apparatus of example 21 and/or some other examples herein, wherein the first controller is on a first die, the second controller is on a second die, and the apparatus including the first die and the second die is within a package.

Example 23 may include the apparatus of example 21 and/or some other examples herein, wherein the first controller operates at a first voltage, and the second controller operates at a second voltage different from the first voltage.

Example 24 may include the apparatus of example 21 and/or some other examples herein, wherein the first communication protocol is a USB 3.x protocol, the second communication protocol is a USB 2.0 or USB 1.1 protocol, and the communication port is a USB type-C communication port.

Example 25 may include the apparatus of example 21 and/or some other examples herein, wherein the communication port is a USB type-C communication port, the first communication protocol is a USB 3.x protocol, and the second communication protocol is a USB 2.0 or USB 1.1 protocol, the first controller is a USB 3.x controller, the second controller is a USB 2.0 or USB 1.1 controller, a first finite state machine of the one or more state machines is to select the USB 3.x controller to control communication according to the USB 3.x protocol through the first group of pins of the USB type-C communication port, and a second finite state machine of the one or more state machines is to select the USB 2.0 or USB 1.1 controller to control communication according to the USB 2.0 or USB 1.1 protocol through the second group of pins of the USB type-C communication port.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. An apparatus for facilitating communication between a first device having the apparatus, and a second device, comprising:
a first controller to couple with an interface circuitry of the first device to operate at a first voltage level to control communication from or to the second device via a first group of pins of the interface circuitry of the first device, according to a first communication protocol;
a second controller to couple with the interface circuitry of the first device to operate at a second voltage level to control communication from or to the second device via a second group of pins of the interface circuitry of the first device, according to a second communication protocol; and
coordination circuitry, either coupled to the first and second controllers, or disposed in part in the first controller and in part in the second controller, to select the first controller to control communication from or to the second device via the first group of pins of the interface circuitry according to the first communication protocol, when the first device is to operate in a first mode with the interface circuitry having a first port directional orientation relative to the second device, and select the second controller to control communication from or to the second device via the second group of pins of the interface circuitry, according to the second communication protocol when the first device is to operate in a second mode with the interface circuitry having a second port directional orientation relative to the second device;
wherein the first and second voltage levels are different voltage levels; the first and second communication protocols are different communication protocols at least in part; the first and second groups of pins are different pins at least in part; the first and second modes are different modes, and the first and second port directional orientations are different port directional orientations.

2. The apparatus of claim 1, wherein the first mode is a host mode and the first port directional orientation is a downstream facing port orientation with the interface circuitry as a downstream facing port to the second device; and the second mode is a device mode and the first port directional orientation is an upstream facing port orientation with the interface circuitry as an upstream facing port to the second device.

3. The apparatus of claim 1, further including one or more interconnects to couple the coordination circuitry, the first controller, and the second controller.

4. The apparatus of claim 1, wherein the first voltage level is larger than or equal to 3.3 voltage, and the second voltage level is less than 3.0 voltage.

5. The apparatus of claim 1, wherein the first communication protocol is a USB 3.x protocol, the second communication protocol is a USB 2.0 or USB 1.1 protocol, and the interface circuitry is a USB type-C interface circuitry.

6. The apparatus of claim 1, wherein the first protocol or the second protocol is a bi-directional communication protocol, or a half-duplex communication protocol.

7. The apparatus of claim 1, wherein the interface circuitry further includes a third group of pins to facilitate communication to or from the third group of pins, according to a third communication protocol, selected from either a mobile industry processor interface display serial interface (MIPI-DSI) protocol, a high-definition multimedia interface (HDMI) protocol, a display port (DP) protocol, a Miracast protocol, a wireless display (WiDi) protocol, a serial peripheral interface (SPI) protocol, a scalable coherent interface (SCI) protocol, a small computer system interface (SCSI) protocol, a peripheral component interconnect (PCI) protocol, or an inter-integrated circuit ($I^2C$) protocol; wherein the third communication protocol differs from the first and second communication protocols, and the third group of pins differs from the first and second groups of pins, at least in part.

8. The apparatus of claim 1, wherein the coordination circuitry includes a first finite state machine, and a second finite state machine coupled to the first finite state machine by an interconnect; wherein the first finite state machine is to select the first controller to control communication to or from the second device via the first group of pins of the interface circuitry according to the first communication protocol; and wherein the second finite state machine is to select the second controller to control communication to or from the second device via the second group of pins of the interface circuitry according to the second communication protocol.

9. The apparatus of claim 8, wherein the first communication protocol is a USB 3.x protocol, the second communication protocol is a USB 2.0 or USB 1.1 protocol, and the interface circuitry is a USB type-C interface circuitry, the first controller is a USB 3.x controller, the second controller is a USB 2.0 or USB 1.1 controller, the first finite state machine is to select the USB 3.x controller to control communication to or from the second device according to the USB 3.x protocol through the first group of pins of the USB type-C interface circuitry, and the second finite state machine is to select the USB 2.0 or USB 1.1 controller to control communication to or from the second device according to the USB 2.0 or USB 1.1 protocol through the second group of pins of the USB type-C interface circuitry.

10. An apparatus for facilitating communication between a first device having the apparatus, and a second device, comprising:
  a first die having first control circuitry to couple with an interface circuitry of the first device to control communication from or to the second device via a first group of pins of a connector of the first device according to a first generation of a serial communication protocol;
  a second die to couple with the interface circuitry of the first device to control communication from or to the second device via a second group of pins of the connector of the first device according to a second generation of the serial communication protocol; and
  coordination circuitry, either coupled to the first and second control circuitry, or disposed in part in the first control circuitry and in part in the second control circuitry, to select the first control circuitry to control communication from or to the second device via the first group of pins of the connector according to the first communication protocol, when the first device is to operate in a first mode with the connector having a first port directional orientation relative to the second device, and select the second control circuitry to control communication from or to the second device via the second group of pins of the connector, according to the second communication protocol when the first device is to operate in a second mode with the connector having a second port directional orientation relative to the second device;
  wherein the first and second dice are different dice; the first and second group of pins are different pins at least in part; the first and second modes are different modes, and the first and second port directional orientations are different port directional orientations.

11. The apparatus of claim 10, wherein the apparatus including the first die and the second die is within a package.

12. The apparatus of claim 10, wherein the first mode is a host mode and the first port directional orientation is a downstream facing port orientation with the connector as a downstream facing port to the second device; and the second mode is a device mode and the first port directional orientation is an upstream facing port orientation with the connector as an as upstream facing ports to the second device.

13. The apparatus of claim 10, wherein the first generation of a serial communication protocol is a USB 3.x protocol, the second generation of the serial communication protocol is a USB 2.0 or USB 1.1 protocol, and the connector is a USB type-C connector.

14. The apparatus of claim 10, wherein the first die is to operate at a first voltage level, the second die is to operate at a second voltage level, and the first and second voltage levels are different voltage levels.

15. The apparatus of claim 10, wherein the coordination circuitry includes a first finite state machine, and a second finite state machine coupled to the first finite state machine by an interconnect, wherein the first finite state machine is to select the first control circuitry to control communication to or from the second device via the first group of pins of the connector according to the first generation of the serial communication protocol, and the second finite state machine is to select the second control circuitry to control communication to or from the second device via the second group of pins of the connector according to the second generation of the serial communication protocol.

16. The apparatus of claim 15, wherein the connector is a USB type-C connector, the first generation of the serial communication protocol is a USB 3.x protocol, and the second generation of the serial communication protocol is a USB 2.0 or USB 1.1 protocol, the first control circuitry is a USB 3.x controller, the second control circuitry is a USB 2.0 or USB 1.1 controller, the first finite state machine is to select the USB 3.x control circuitry to control communication according to the USB 3.x protocol to or from the second device via the first group of pins of the USB type-C connector, and the second finite state machine is to select the USB 2.0 or USB 1.1 control circuitry to control communication according to the USB 2.0 or USB 1.1 protocol to or from the second device via the second group of pins of the USB type-C connector.

17. The apparatus of claim 16, wherein the coordination circuitry further includes first and second circuitry;
  wherein the first circuitry is coupled to the first finite state machine to indicate whether the USB 3.x controller is to control communication; and
  wherein the second circuitry is coupled to the second finite state machine to indicate whether the USB 2.0 or USB 1.1 controller is to control communication.

18. The apparatus of claim 16, wherein the first finite state machine acts as a master device to the second finite state machine; wherein the first finite state machine sends a message to the second finite state machine to activate the second controller when the first finite state machine has failed to select the USB 3.x controller to control communication according to the USB 3.x protocol through the first group of pins of the USB type-C interface circuitry.

19. The apparatus of claim 16, wherein the second finite state machine sends a message to the first finite state machine when the second finite state machine has failed to select the USB 2.0 or USB 1.1 controller to control communication according to the USB 2.0 or USB 1.1 protocol through the second group of pins of the USB type-C interface circuitry.

20. A device for computing, comprising:
  a printed circuit board (PCB);
  a computer processor disposed on the PCB;
  a communication port disposed at an edge of the PCB;
  a first controller coupled with the communication port to control communication from or to another device via a first group of pins of the communication port according to a first communication protocol;
  a second controller coupled with the communication port to control communication from or to the other device via a second group of pins of the communication port according to a second communication protocol; and one or more state machines to select the first controller to control communication from or to the other device via the first group of pins of the communication port according to the first communication protocol, when the device is to operate in a first mode with the communication port having a first port directional orientation relative to the other device, and select the second controller to control communication from or to the other device via the second group of pins of the communication port, according to the second communication protocol when the device is to operate in a second mode with the communication port having a second port directional orientation relative to the other device;

wherein the first and second group of pins are different pins at least in part; the first and second modes are different modes, and the first and second port directional orientations are different port directional orientations.

21. The device of claim 20, wherein the first controller is on a first die, the second controller is on a second die, and the apparatus device including the first die and the second die is within a package.

22. The device of claim 20, wherein the first controller operates at a first voltage, and the second controller operates at a second voltage different from the first voltage.

23. The device of claim 20, wherein the first communication protocol is a USB 3.x protocol, the second communication protocol is a USB 2.0 or USB 1.1 protocol, and the communication port is a USB type-C communication port.

24. The device of claim 20, wherein the communication port is a USB type-C communication port, the first communication protocol is a USB 3.x protocol, and the second communication protocol is a USB 2.0 or USB 1.1 protocol, the first controller is a USB 3.x controller, the second controller is a USB 2.0 or USB 1.1 controller, a first finite state machine of the one or more state machines is to select the USB 3.x controller to control communication with the other device according to the USB 3.x protocol through the first group of pins of the USB type-C communication port, and a second finite state machine of the one or more state machines is to select the USB 2.0 or USB 1.1 controller to control communication with the other device according to the USB 2.0 or USB 1.1 protocol through the second group of pins of the USB type-C communication port.

* * * * *